US006614842B1

(12) United States Patent
Chou et al.

(10) Patent No.: US 6,614,842 B1
(45) Date of Patent: Sep. 2, 2003

(54) FIR FILTER ARCHITECTURE FOR 100BASE-TX RECEIVER

(75) Inventors: Gerchih Chou, San Jose, CA (US); Gwo-Chung Tai, San Jose, CA (US)

(73) Assignee: Infineon Technologies North America, Iselin, NJ (US)

( * ) Notice: Subject to any disclaimer, the term of this patent is extended or adjusted under 35 U.S.C. 154(b) by 293 days.

(21) Appl. No.: 09/615,116

(22) Filed: Jul. 13, 2000

(51) Int. Cl.$^7$ .............................. H03H 7/30; H04B 1/10

(52) U.S. Cl. ...................................... 375/232; 375/350

(58) Field of Search ................................ 375/232, 233, 375/236, 316, 350, 345; 708/322, 323, 229

(56) References Cited

U.S. PATENT DOCUMENTS 5,822,423 A * 10/1998 Jehnert et al. .............. 379/352
6,047,026 A *  4/2000 Chao et al. ................. 375/233

OTHER PUBLICATIONS

Shoval, Ayal; Omid Shoaei; Kathleen O. Lee and Robert H. Leonowich, "A CMOS Mixed–Signal 100Mb/s Receive Architecture for Fast Ethernet," IEEE 1998 Custom Integrated Circuits Conference, pp. 253–256.
Everitt, James; James F. Parker; Paul Hurst; Dave Nack and Kishan Rao Konda, "A CMOS Transceiver for 10–Mb/s and 100–Mb/s Ethernet," IEEE Journal of Solid–State Circuits, vol. 33, No. 12, Dec. 1998, pp. 2169–2177.

Shoaei, Omid; Ayal Shoval and Robert Leonowich, "A 3V Low–Power 0–25 $\mu$m CMOS 100Mb/s Receiver for Fast Ethernet," International Solid–State Circuit Conference 2000/Session 18/Wireline Communications/Paper WA 18.4, pp. 308–309.
Kelly, N. Patrick; Daniel L. Ray and David W. Vogel, "A Mixed–Signal DFE/FFE Receiver for 100Base–TX Applications," International Solid–State Circuit Conference 2000/Sessuib 18/Wireline Communications/Paper WA 18.5, pp. 310–311.

* cited by examiner

*Primary Examiner*—Khai Tran
(74) *Attorney, Agent, or Firm*—Daniel J. Bedell; Smith-Hill and Bedell

(57) ABSTRACT

A 100Base-TX receiver employs a finite impulse response (FIR) filter to provide both equalization and insertion loss compensation for an MLT-3 input signal. The FIR filter includes three delay stages, each delaying the input signal with an 8 ns delay (the period of one data cycle of the MLT-3 input signal), a set of three amplifiers for amplifying the delay stage outputs with gains C1, C2 and C3, and a summer for summing the outputs of the three amplifiers to produce a compensated, equalized MLT-3 signal. A low-pass filter filters the FIR filter output signal, and a data slicer digitizes the low-pass filter output during each data cycle to produce data representing the incoming MLT-3 as having one of six levels. An adaptive control signal processes the slicer output data to determine how to set the gains C1, C2 and C3 of the three FIR amplifiers to provide the correct amount of equalization and compensation. The adaptive control circuit also processes the slice data to adaptively adjust the phase of a clock signal controlling timing of the data slicer, to adaptively adjust an amount of baseline wander compensation provided to the MLT-3 signal, and to determine the value of data conveyed by the MLT-3 input signal.

20 Claims, 10 Drawing Sheets

FIR FILTER ARCHITECTURE FOR 100BASE-TX RECEIVER

BACKGROUND OF THE INVENTION

1. Field of the Invention

The present invention relates in general to receivers for decoding 100Base-TX signals, and in particular to a receiver employing a finite impulse response (FIR) filter for adaptive equalization and automatic gain control.

2. Description of Related Art

Figure 1:
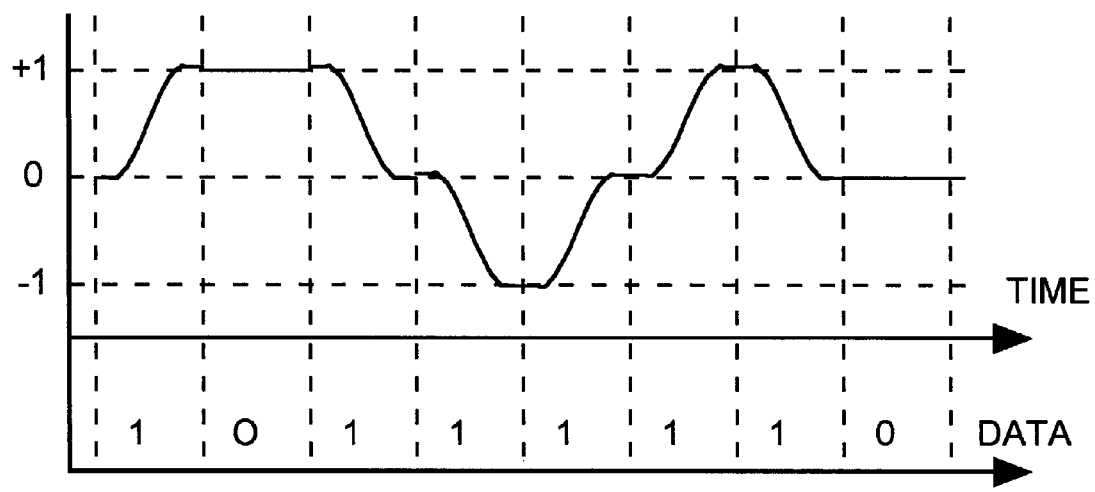

The IEEE 802.3 ("Ethernet") standard defining a digital media interface commonly used for transmitting data between computers linked through a network includes a "100Base-TX" protocol for category 5 (CAT5) twisted-pair data transmission employing MLT-3 line encoding. FIG. 1 is a timing diagram illustrating how data is represented by an "ideal" MLT-3 encoded waveform. The MLT-3 waveform is organized into a sequence of 8 ns (nanosecond) data cycles and conveys data at a rate of 125 Mb/s (megabits per second), one bit of data per data cycle. The MLT-3 standard defines three voltage levels referenced as +1, 0 and −1. During each cycle the waveform may stay at the same level, or may transition from level +1 to level 0, from level 0 to level −1, from level −1 to level 0, or from level 0 to level +1. When the waveform does not transition between levels during a current (Kth) data cycle, it represents the same data value as it represented during the preceding (K−1)th data cycle. When the waveform transitions during the Kth data cycle, it represents a bit of state opposite to that of bit represented during the preceding (K−1)th data cycle.

Figure 2:
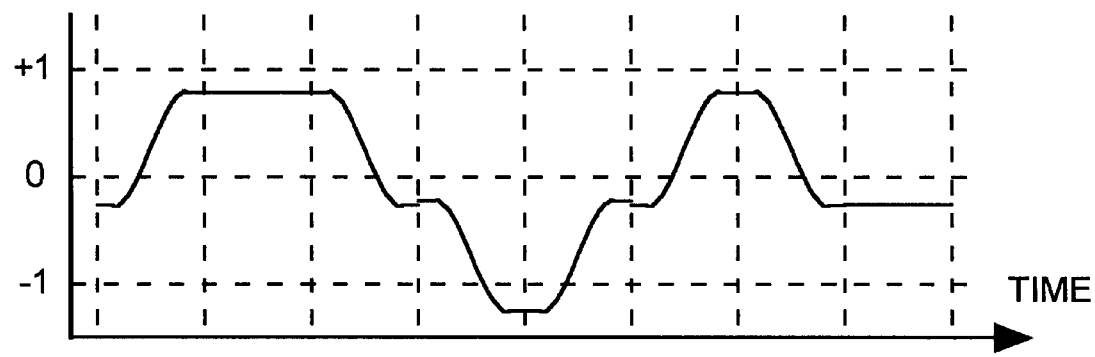
Figure 3:
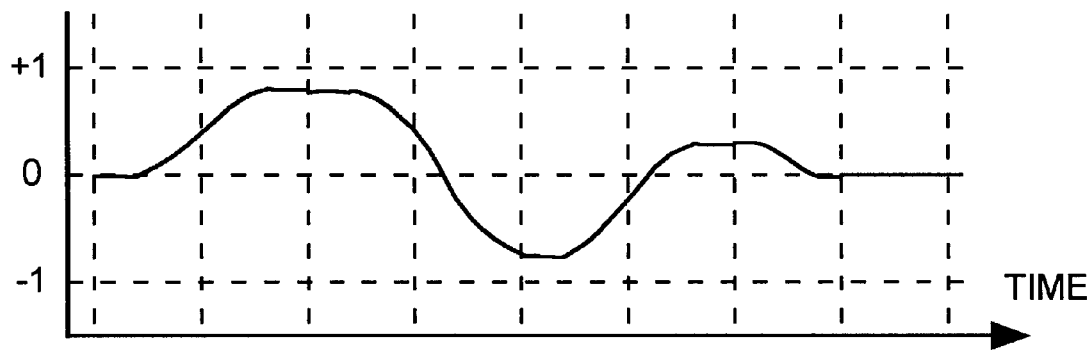

As the MLT-3 waveform travels over a network it can be distorted in ways that can make it difficult for a receiver to extract the data conveyed by the waveform. Communication channels conveying the MLT-3 waveform include magnetic modules coupling the waveform onto the twisted pair cable. Since these modules act like high pass filters, they attenuate low frequency components of the waveform. Thus when an MLT-3 waveform has relatively few transitions during a relatively long period, it appears as a low frequency signal, and the magnetic modules cause the waveform to suffer a type of distortion called "baseline wander" as illustrated in FIG. 2. The twisted pair conveying an MLT-3 waveform also has an insertion loss and a frequency-dependent attenuation that can further distort the waveform, for example as illustrated in FIG. 3. To avoid errors in decoding an MLT-3 waveform, a 100Base-TX receiver should provide baseline wander correction, gain control compensation for insertion loss and equalization for frequency-dependent attenuation of the twisted pair.

Figure 4:
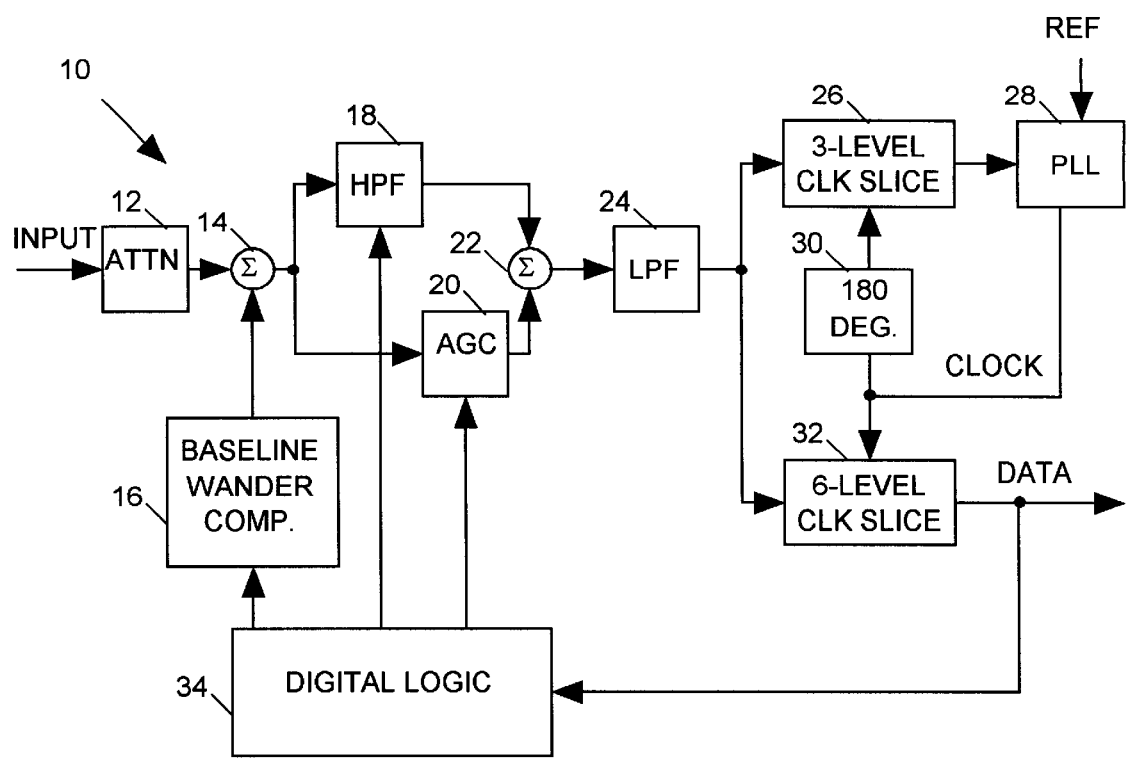

The paper entitled "A CMOS Transceiver for 10 Mb/s and 100 Mb/s Ethernet", by Everitt et al, published December 1998 in the IEEE Journal of Solid-State Circuits, Vol 33, No 12, describes a receiver illustrated herein in FIG. 4. An attenuator 12 attenuates the input MLT-3 signal to prevent clipping. A summer 14 adds the output of a baseline compensation circuit is to the output of attenuator 12 to level shift the MLT-3 signal as necessary to compensate for any base line wander. A high-pass filter 18 having adjustable frequency response characteristics filters the output of summer 14 to provide equalization, and an automatic gain control (AGC) circuit 20 amplifies the output of summer 14 to compensate for insertion loss. A summer 22 sums the outputs of high-pass filter is and AGC 20 to supply an equalized and compensated MLT-3 signal to a low-pass filter 24 which filters high frequency noise out of the signal.

A three-level clock-recovery slice circuit 26, phase-locked loop circuit 28 and 180 degree phase shifter 30 process the waveform output of low pass filter 24 to produce a 125 Mhz clock signal (CLOCK) phase locked to the MLT-3 waveform. The CLOCK signal clocks a six-level bit slice circuit 32 which produces data representing the voltage of the MLT-3 waveform output of low pass filter 24 as one of six levels. Other circuits (not shown) recover the transmitted data from the output data of slice circuit 32. The data output of slice circuit 32 also provides input to a digital logic circuit 34 which processes that data to control the amount compensation to be provided by baseline wander compensation circuit 16 and AGC circuit 20 and to adjust high pass filter 18 as needed to compensate for frequency-dependent attenuation.

With a high component count, the receiver requires substantial power and die area. What is needed is a 100Base-TX receiver having lower power and die area requirements.

SUMMARY OF THE INVENTION

A 100Base-TX Receiver in accordance with the invention employs a finite impulse response (FIR) filter to provide both equalization and insertion loss compensation for an MLT-3 input signal.

The FIR filter includes three delay stages, each delaying the input signal with an 8 ns delay (the period of one data cycle of the MLT-3 input signal), a set of three amplifiers for amplifying the delay stage outputs with gains C1, C2 and C3, and a summer for summing the outputs of the three amplifiers to produce a compensated, equalized MLT-3 signal. The receiver also includes a low-pass filter for filtering high frequency noise out of the FIR filter output signal.

A data slicer digitizes the low-pass filter's output MLT-3 signal during each data cycle to produce slice data representing that MLT-3 signal as being within one of six levels. An adaptive control signal processes the slice data to adaptively adjust the gains C1, C2 and C3 of the three FIR amplifiers to provide a correct amount of equalization and insertion loss compensation.

The adaptive control circuit also processes the slice data to adaptively adjust the phase of a clock signal controlling timing of the data slicer, to adaptively adjust an amount of baseline wander compensation provided to the MLT-3 input signal, and to produce an output digital signal representing the data sequence conveyed by the MLT-3 input signal.

The use of an FIR filter to provide equalization and compensation reduces the amount of area on an integrated circuit die needed to implement a 100Base-TX receiver and allows the receiver to operate with less power than prior art 100Base-TX receivers.

The concluding portion of this specification particularly points out and distinctly claims the subject matter of the present invention. However those skilled in the art will best understand both the organization and method of operation of the invention, together with further advantages and objects thereof, by reading the remaining portions of the specification in view of the accompanying drawing(s) wherein like reference characters refer to like elements.

BRIEF DESCRIPTION OF THE DRAWING(S)

Figure 5:
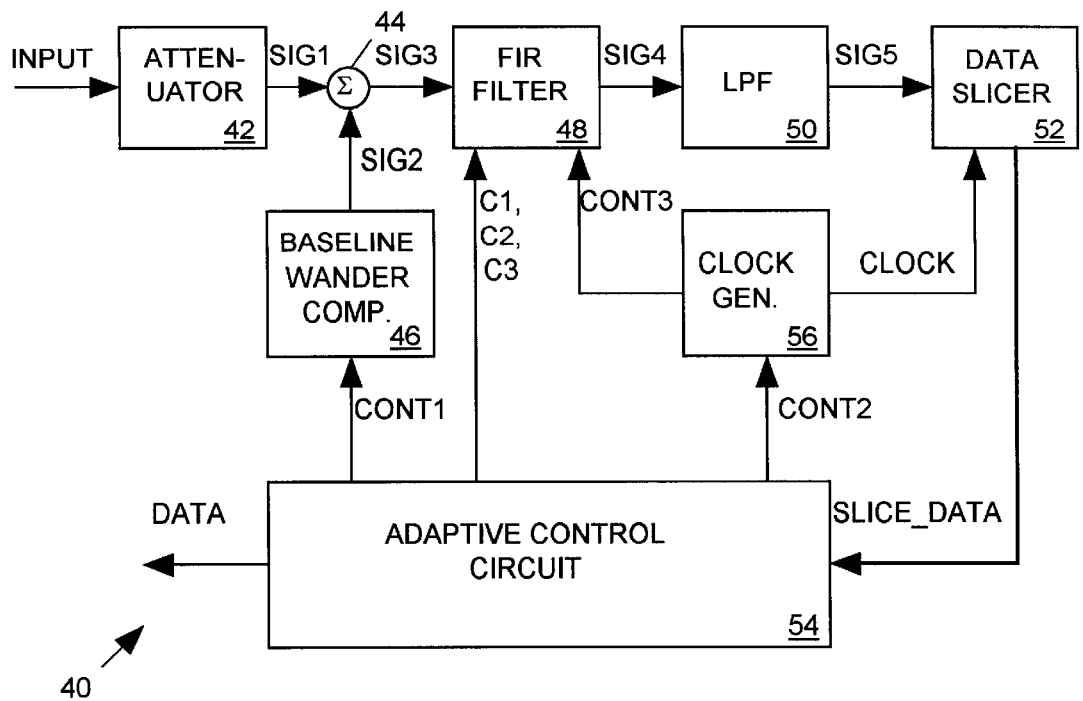
Figure 6:
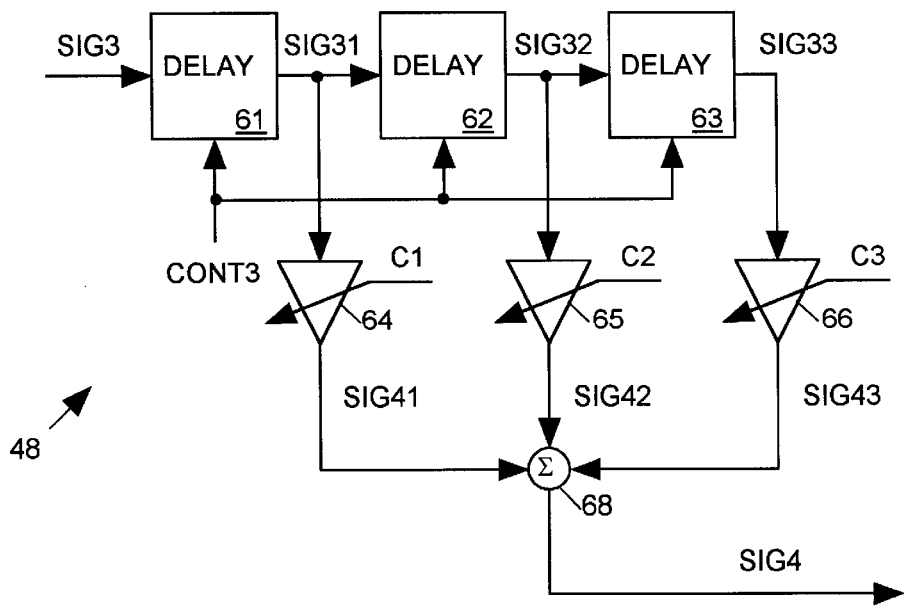
Figure 7:
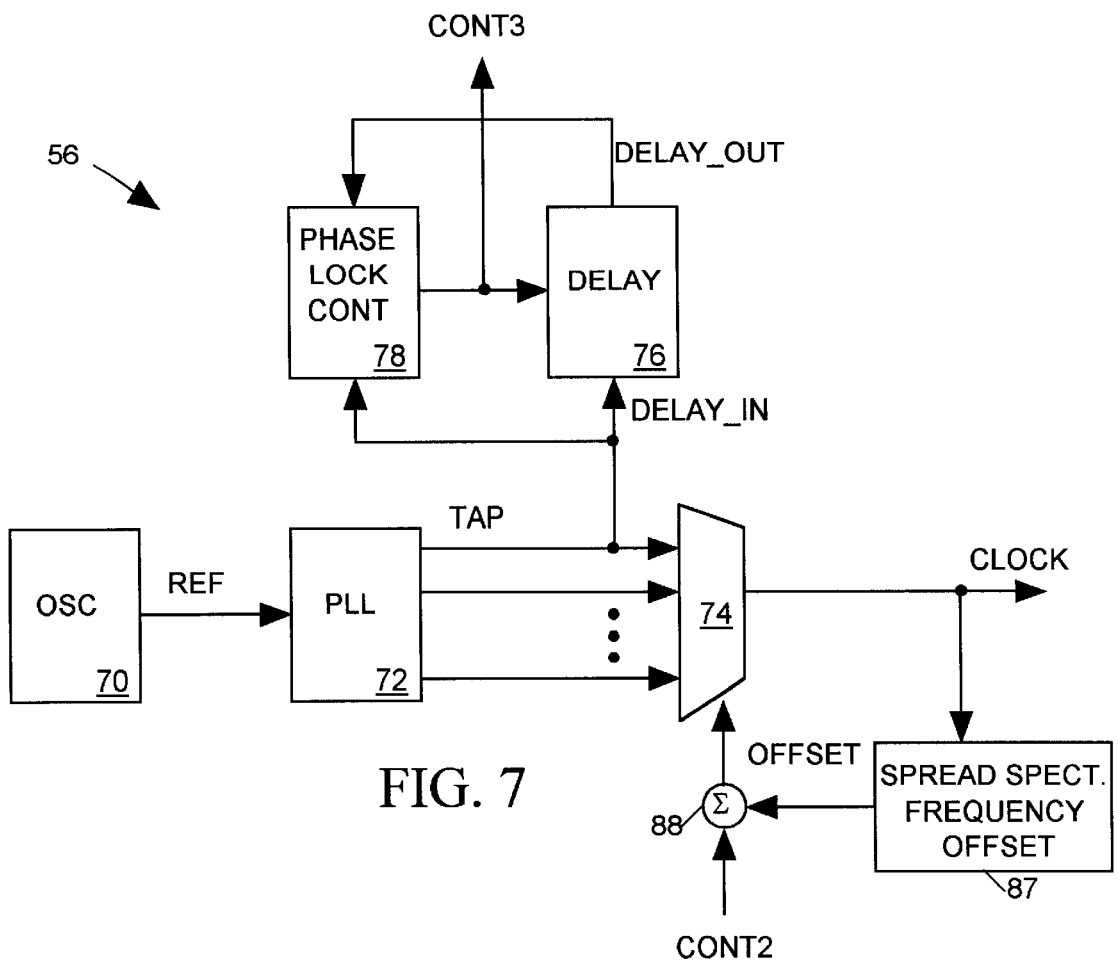
Figure 8:
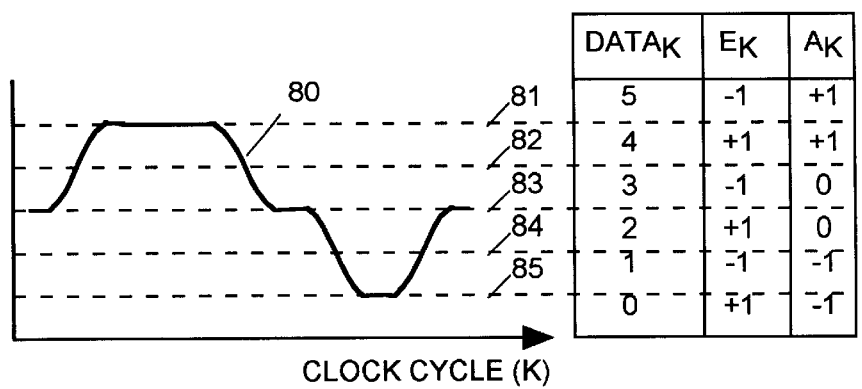
Figure 9:
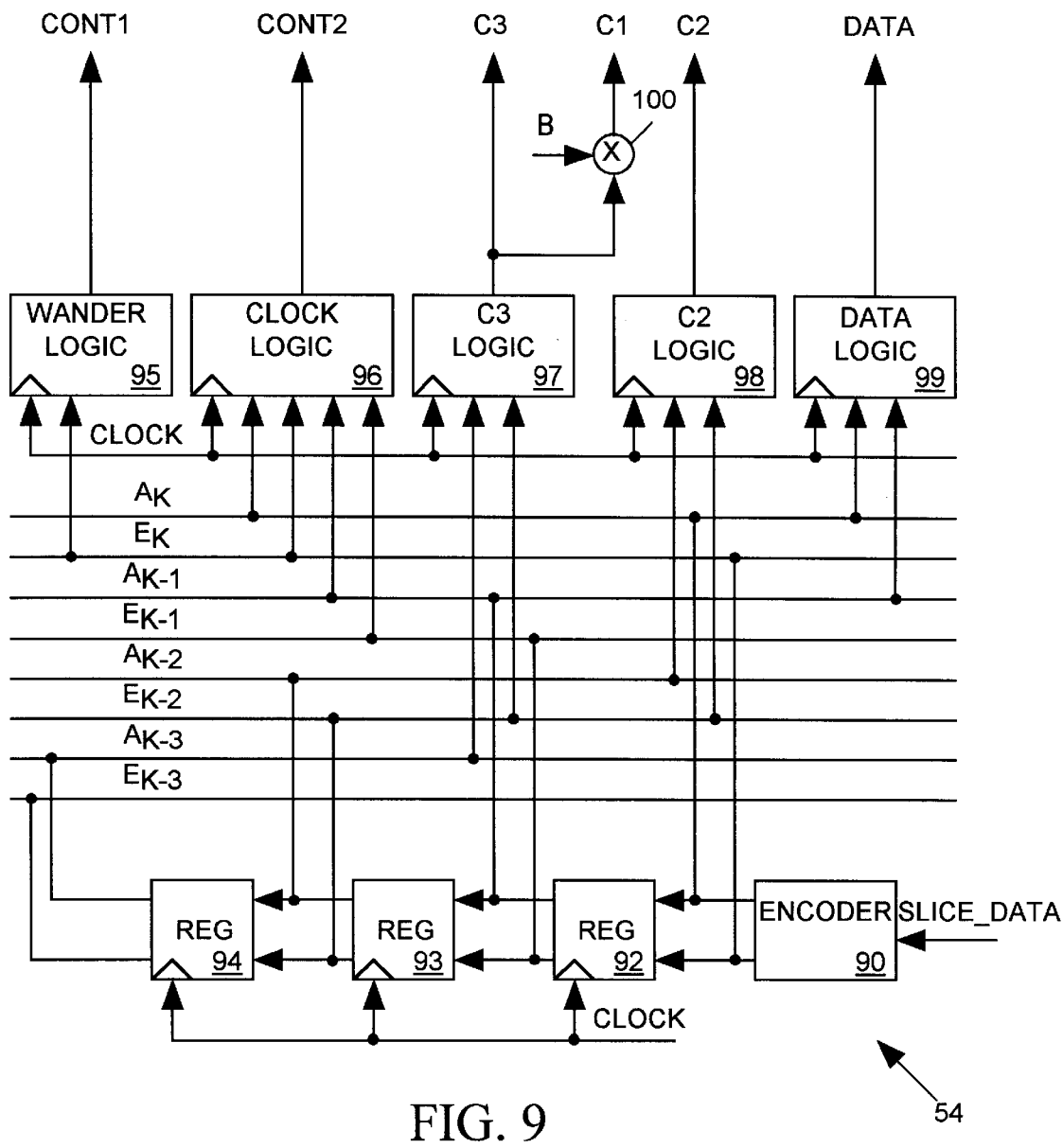
Figure 10:
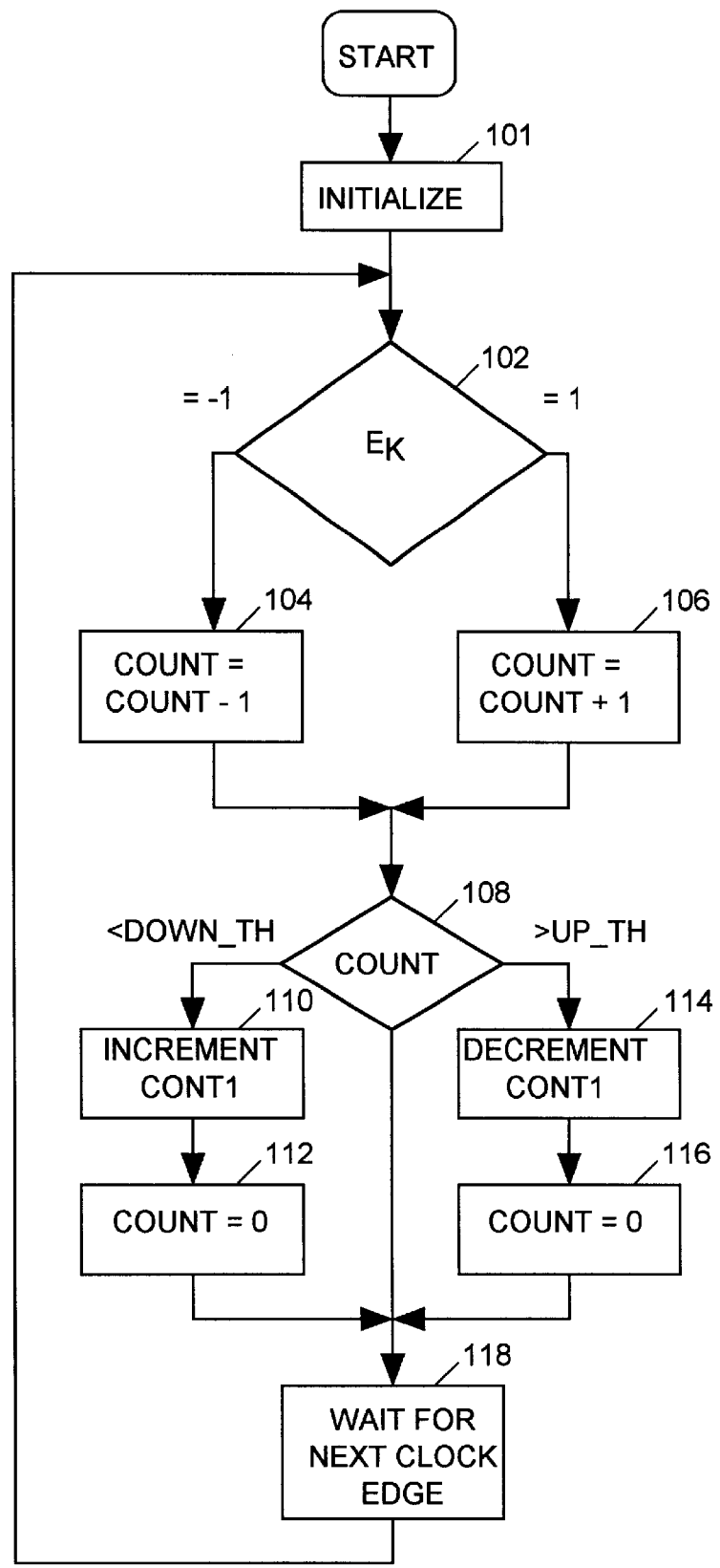
Figures 11, 12:
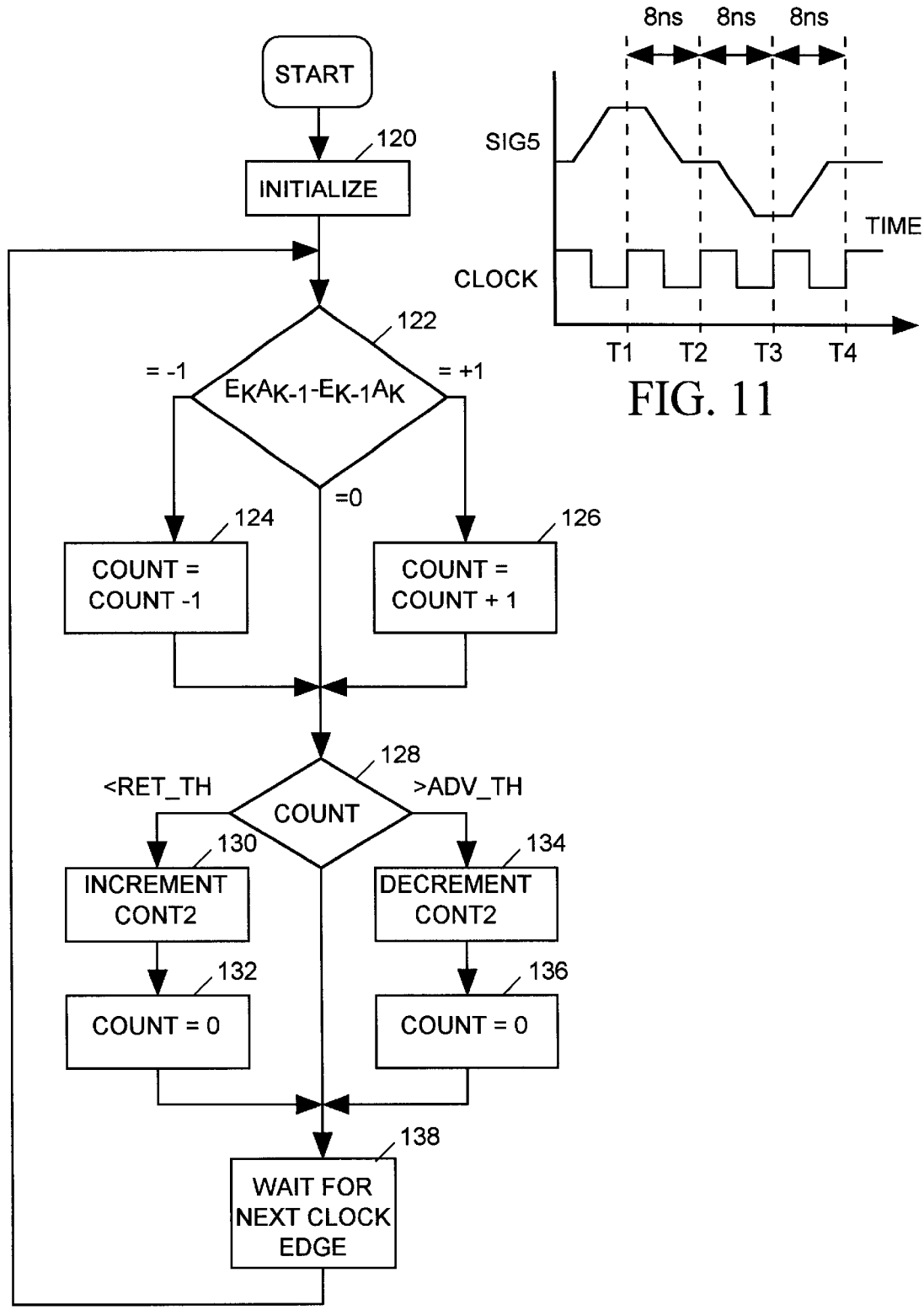
Figures 13, 14:
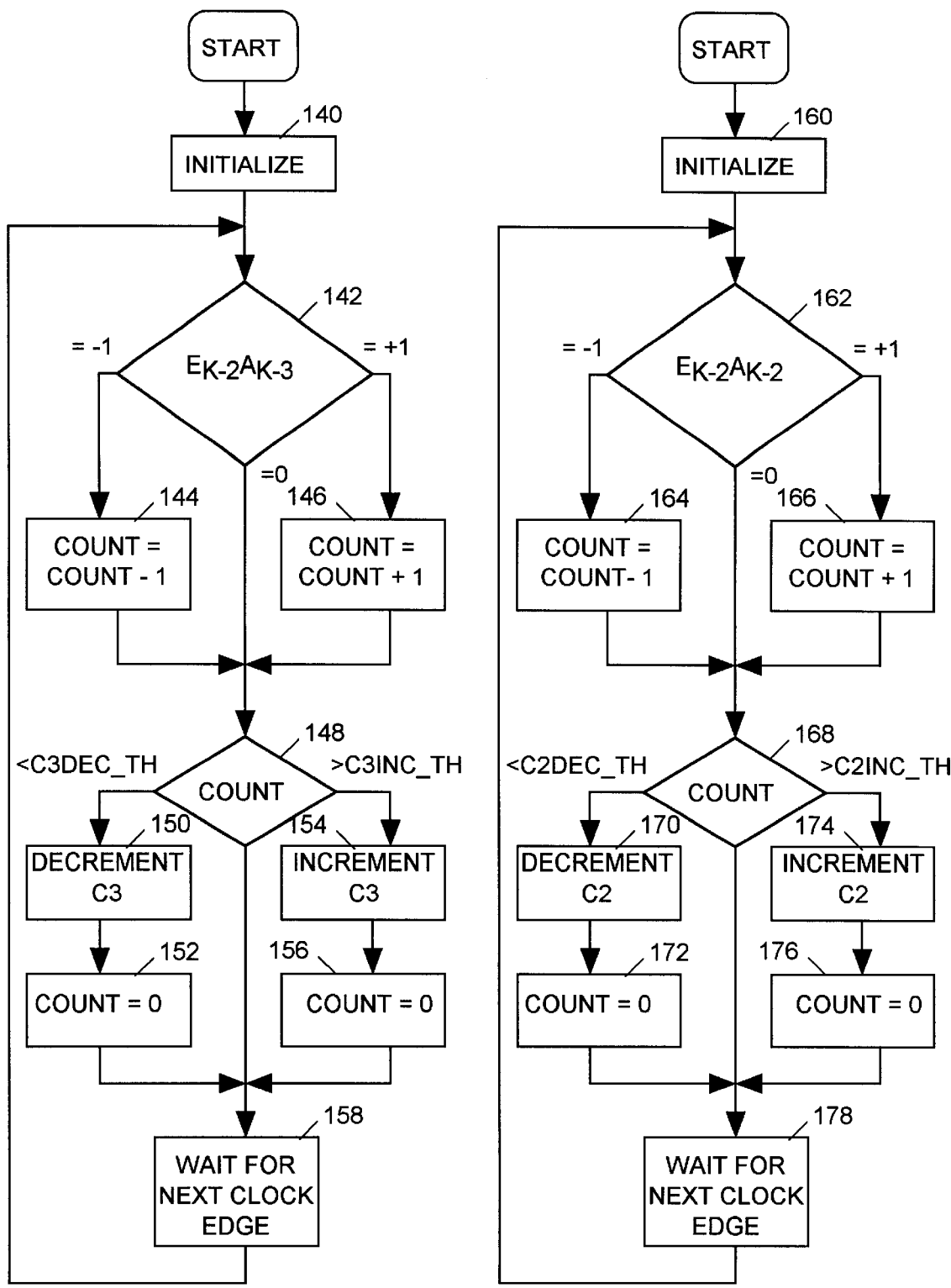
Figure 15:
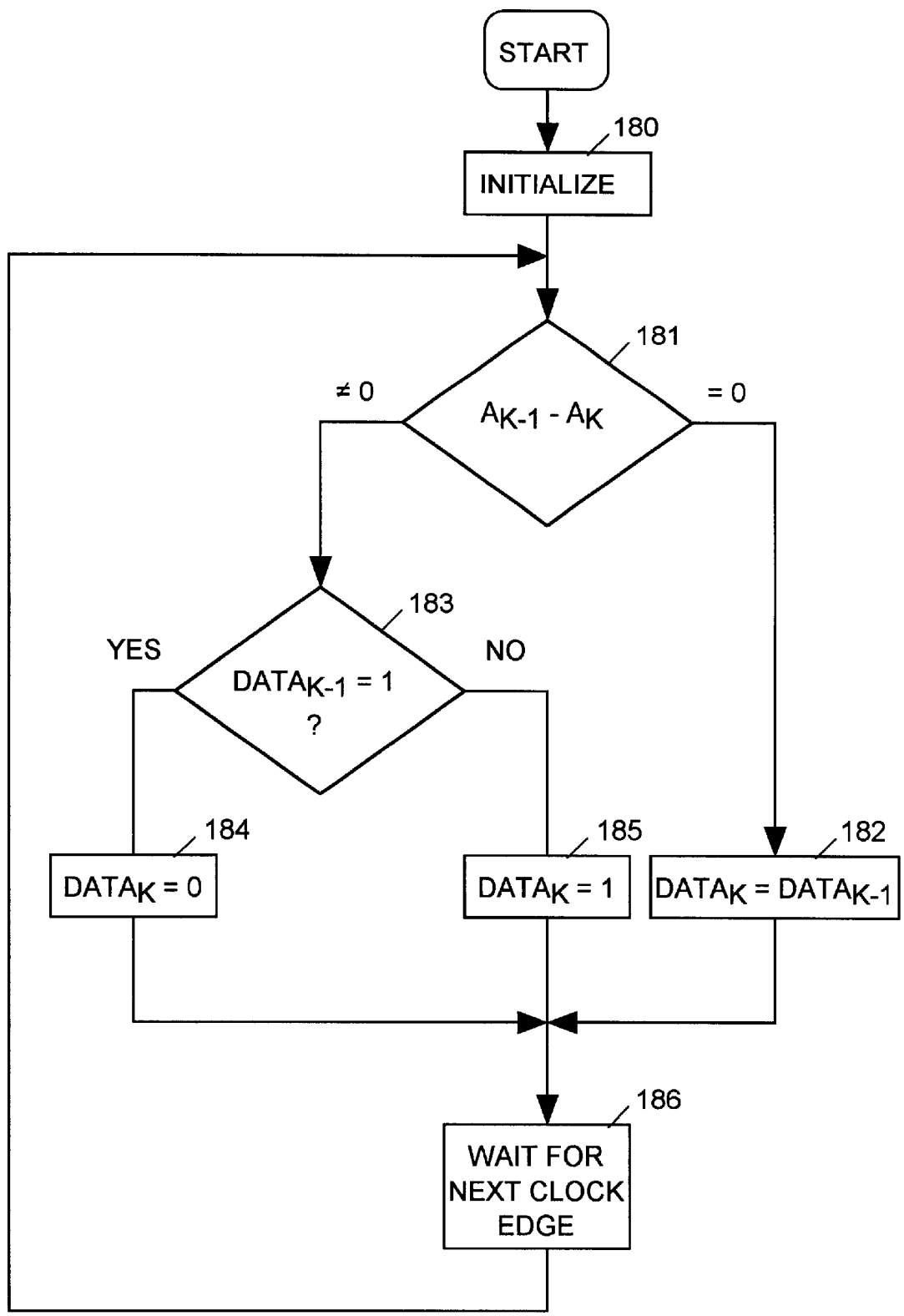
Figure 16:
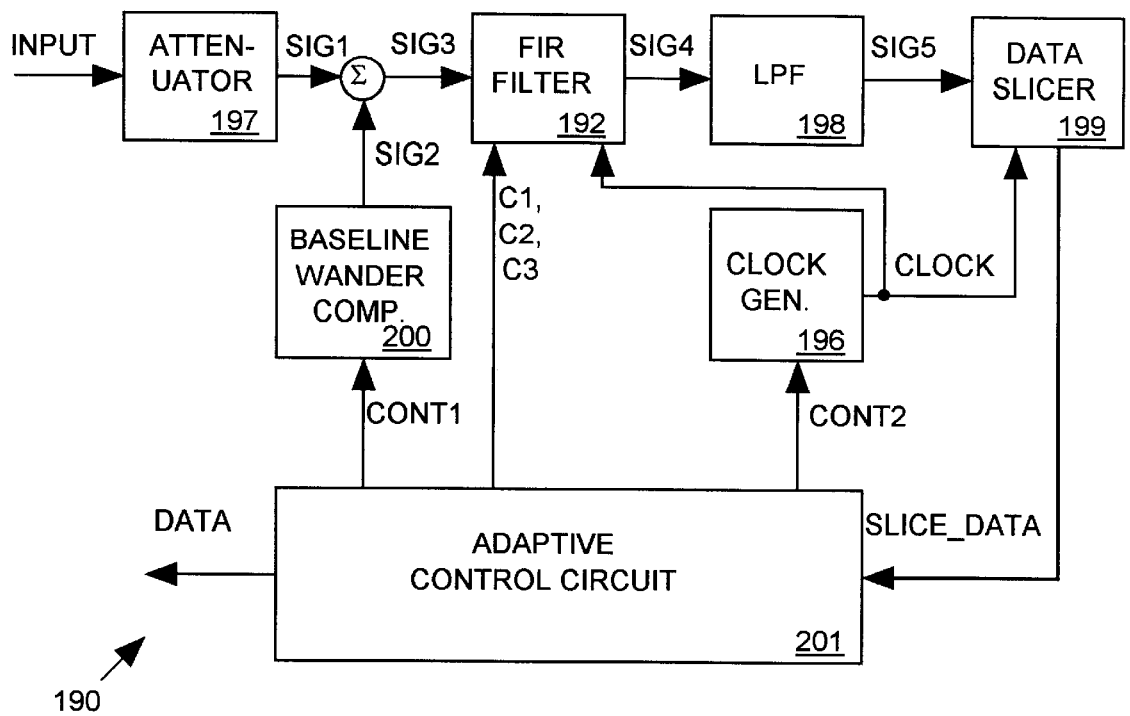
Figure 17:
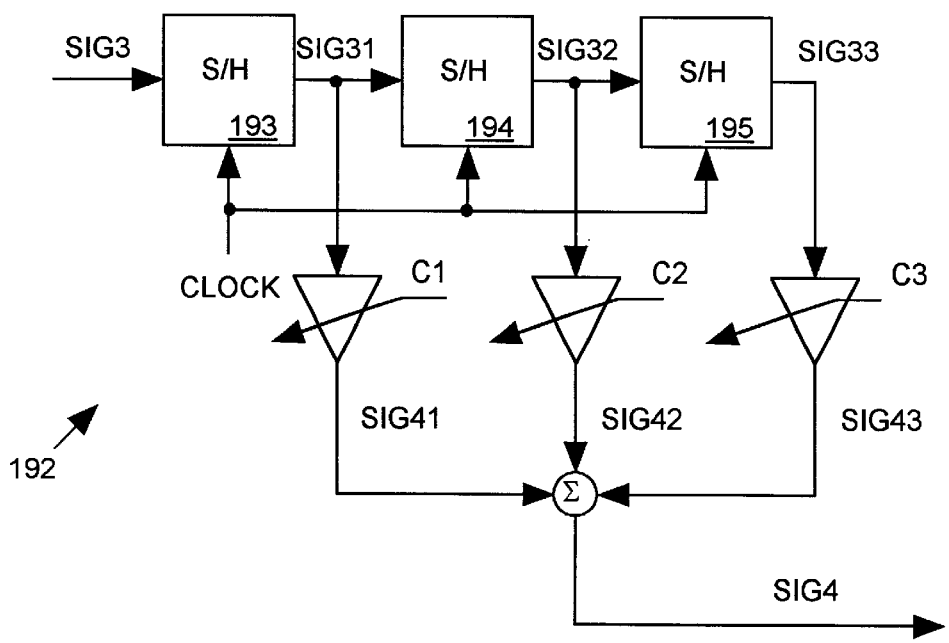

FIG. 1 is a timing diagram illustrating how data is represented by an "ideal" MLT-3 encoded waveform., FIG. 2 is a timing diagram illustrating baseline wander in an MLT-3 encoded waveform, FIG. 3 is a timing diagram illustrating insertion loss and frequency-dependent attenuation in an MLT-3 encoded waveform, FIG. 4 illustrates a prior art 100Base-TX receiver in block diagram form, FIG. 5 illustrates a 100Base-TX receiver in accordance with the invention in block diagram form, FIG. 6 illustrates the finite impulse response filter of FIG. 5 in more detailed block diagram form, FIG. 7 illustrates the clock generation circuit of FIG. 5 in more detailed block diagram form, FIG. 8 is a timing diagram illustrating an MLT-3 waveform and indicating signal levels sensed by the data slicer of FIG. 5, FIG. 9 illustrates the adaptive control circuit of FIG. 5 in more detailed block diagram form, FIG. 10 illustrates the logic carried out by the wander logic circuit of FIG. 9 in flow chart form, FIG. 11 is a timing diagram illustrating phase relationships between the SIG5 waveform and CLOCK signal of FIG. 5, FIG. 12 illustrates the logic carried out by the clock logic circuit of FIG. 9 in flow chart form, FIG. 13 illustrates the logic carried out by the C3 logic circuit of FIG. 9 in flow chart form, FIG. 14 illustrates the logic carried out by the C2 logic circuit of FIG. 9 in flow chart form, FIG. 15 illustrates the logic carried out by the data logic circuit of FIG. 9 in flow chart form, FIG. 16 illustrates an alternative embodiment of a 100Base-Tx receiver in accordance with the invention in block diagram form, and FIG. 17 illustrates the FIR filter of FIG. 16 in more detailed block diagram form.

DESCRIPTION OF THE PREFERRED EMBODIMENT(S)

Receiver Architecture

The present invention relates to a 100Base-TX receiver for receiving an MLT-3 encoded input signal and producing a digital output signal representing a data sequence conveyed by the INPUT signal. In accordance with the invention, the receiver employs an adaptively-controlled, three-stage, finite-impulse response (FIR) filter to provide both automatic gain control compensation and equalization for the MLT-3 encoded waveform. Since the FIR filter requires only three stages to provide compensation and equalization, its implementation does not require a large number of circuit components. The use of a three-stage FIR filter to provide equalization and compensation therefore reduces the amount of area on an integrated circuit die needed to implement a 100Base-TX receiver and allows the receiver to operate with less power than prior art 100Base-TX receivers.

FIG. 5 illustrates in block diagram form a 100Base-TX receiver 40 in accordance with the present invention. Receiver 40 includes a conventional attenuator 42 for attenuating the MLT-3 encoded input signal (INPUT), for example by a factor of five, to produce an output signal SIG1 not subject to clipping. A summing circuit 44 sums the SIG1 output of attenuator 42 with an output (SIG2) of a baseline wander compensation circuit 46 to produce an output signal SIG3. The SIG2 signal level-shifts the SIG1 signal as necessary to provide an SIG3 signal that is compensated for baseline wander. The S103 signal is applied as input to a three-stage finite impulse response (FIR) filter 48 implementing a filter function providing both automatic gain control (AGC) compensation and equalization for the MLT-3 signal. A low pass filter 50 filters the output (SIG4) of FIR filter 48 to remove high frequency noise from the signal. A data slicer 52 digitizes the output (SIG5) of low-pass filter 50 on each pulse of a clock signal (CLOCK), to produce output data (SLICE DATA) representing the voltage of the SIG5 signal as lying within one of six ranges. An adaptive control circuit 54 processes the SLICE_DATA to produce the digital output signal DATA of receiver 40. Control circuit 54 also processes the SLICE_DATA output of slicer 52 to produce an output signal CONT1 controlling the magnitude of the baseline wander compensation circuit's SIG2 output signal and to produce a set of three control signals C1–C3 defining coefficients of FIR filter 48 thereby controlling its behavior.

Control circuit 54 also processes the output SLICE_DATA of data slicer 52 to produce control data CONT2 supplied to a clock generator circuit 56 producing the CLOCK signal that clocks data slicer 52. The CONT2 control data adjusts the phase of the CLOCK signal so that data slicer 52 samples the SIG5 MLT-3 signal at the appropriate time during each cycle. Clock generator 56 also supplies a CONT3 signal input to FIR filter 48 for controlling its stage delay as described below.

FIR Filter

FIG. 6 illustrates FIR filter 48 of FIG. 5 in more detailed block diagram form. FIR filter 48 includes a set of three delay stages 61–63, a set of three amplifiers 64–66, and a summing circuit 68. Delay stages 61–63 are connected in series to successively delay the SIG3 signal output of summer 44 (FIG. 5) to produce a set of three signals SIG31, SIG32 and SIG33 supplied as inputs to amplifiers 64–66. Amplifiers 64–66 amplify their input signals with gains controlled by output signals C1–C3, respectively, of control circuit 54 (FIG. 5) to produce a set of three signals SIG41, SIG42 and SIG43 summed by summer 68 to produce the filter's SIG4 output signal. Control circuit 54 (FIG. 5) adaptively adjusts the values of FIR coefficients C1–C3 so that FIR filter 48 compensates the SIG3 signal for frequency-dependent attenuation and insertion loss in the transmission system conveying the INPUT signal.

Each delay stage 61–63 is suitably a delay circuit providing a delay that depends on the magnitude of an input control voltage. The CONT3 signal output of clock generator 56 (FIG. 5) acts as the control voltage input to delay circuits 61–63 to precisely set each delay stage's delay to 8 ns, the duration of one cycle of the input MLT-3 signal.

Clock Generator

FIG. 7 illustrates in more detailed block diagram form clock generator 56 of FIG. 5 for producing a CLOCK signal controlling the timing of data slicer 52 so that it samples the SIG5 signal at the appropriate time during each data cycle. An oscillator 70 supplies a 25 MHz reference signal (REF) to a phase-locked loop circuit 72 producing a set of 125 MHz signals (TAP) that are evenly distributed in phase. A multiplexer 74 controlled by the CONT2 control data output of control circuit 54 (FIG. 5) selects one of the TAP signals as the CLOCK signal supplied to data slicer 52 of FIG. 5. Thus the CONT2 data recovers the timing of the SIG5 signal input signal to data slicer 52 by controlling the phase of the CLOCK signal relative to the data cycles of the SIG5 signal by determining which TAP signal multiplexer 74 selects.

One of the 125 MHz TAP signals acts as a DELAY_IN input to a delay circuit 76 similar to each of delay stages 61–63 of FIG. 6. A phase lock controller 78 compares the DELAY_IN signal to the output signal (DELAY_OUT) of delay circuit 76 and adjusts an control voltage (CONT3) input to delay circuit 76 so that the DELAY_IN and DELAY_OUT signals are of similar phase. This ensures that the delay of delay circuit 76 equals the duration of one data cycle of the 125 MHz SIG5 signal, 8 ns. Since the CONT3 signal also provides the control input to delay stages 61–63 of FIG. 6, and since delay stages 61–63 are similar to delay circuit 76, delay stages 61–63 will also each provide the desired 8 ns delay.

During an initial period following system startup, a spread spectrum frequency offset circuit 87 produces randomly varying output data (OFFSET). A summer 88 adds the OFFSET data to the CONT2 data and provides the result as the control input to multiplexer 74. The OFFSET data ensures that the CLOCK signal is not initially locked to the zero crossing of the SIG5 signal immediately following system startup. The OFFSET data value is set to zero after the adaptive control system has had sufficient time to appropriately drive the CLOCK signal near its appropriate phase.

Data Slicer

As illustrated in FIG. 8, data slicer 52 of FIG. 5, digitizes the SIG5 signal output of low pass filter 50 during each CLOCK signal cycle to produce digital output data (SLICE_DATA) representing the voltage magnitude of its SIG5 MLT-3 input signal as lying within one of six ranges. A SLICE_DATA value of 5 indicates the SIG5 signal voltage is above the +1 high level (81) of an ideal MLT-3 signal 80. A data value of 4 indicates the SIG5 signal voltage is between the MLT-3 +1 level (81) and a level 82 halfway between the MLT-3 +1 level and the MLT-3 0 level (83). A SLICE_DATA value of 3 indicates the SIG5 signal voltage is between levels 82 and 83. A SLICE_DATA value of 2 indicates the SIG5 signal voltage is between level 83 and a level 84 halfway between level 83 and the MLT-3 –1 level 85. A SLICE_DATA value of 1 indicates the SIG5 signal voltage is between levels 84 and 85. A SLICE_DATA value of 0 indicates the SIG5 signal voltage is below level 85.

Digital Adaptive Control Circuit

FIG. 9 illustrates control circuit 54 of FIG. 5 in more detailed block diagram form. Control circuit 54 includes an encoder circuit 90 which encodes the SLICE_DATA output of data slicer 52 of FIG. 5 to produce two parameters $E_K$ and $A_K$ on each cycle of the CLOCK signal. The subscript "K" refers to the Kth SLICE_DATA value produced by data slicer 52 at time t=KT where T=8 ns. A set of three of series-connected registers 92–94 clocked by the CLOCK signal capture the $A_K$ and $E_K$ data values produced by encoder 90 such that register 92 stores the values $A_{K-1}$ and $E_{K-1}$ for the preceding CLOCK signal cycle (K-1), register 93 stores the values $A_{K-2}$ and $E_{K-2}$ for CLOCK signal cycle K-2, and register 94 stores the values $A_{K-3}$ and $E_{K-3}$ for CLOCK signal cycle K-3.

As illustrated in FIG. 8, a SLICE_DATA value of 5 yields an ($E_K$, $A_K$) data pair of value of (–1, +1), a SLICE_DATA value of 4 yields an ($E_K$, $A_K$) data pair of value of (+1, +1), a SLICE_DATA value of 3 yields an ($E_K$, $A_K$) data pair of value of (–1, +0), a SLICE_DATA value of 2 yields an ($E_K$, $A_K$) data pair of value of (+1, +0), a SLICE_DATA value of 1 yields an ($E_K$, $A_K$) data pair of value of (–1, –1), a SLICE_DATA value of 0 yields an ($E_K$, $A_K$) data pair of value of (+1, –1).

Referring again to FIG. 9, in response to each pulse of the CLOCK signal, a set of four logic circuits 95–99 process the outputs of encoder 90 and registers 92–94 to adjust the values of the CONT1, CONT2, C3, C2 and DATA outputs of adaptive control circuit 54 of FIG. 5. A multiplier (or attenuator) 100 multiples (or attenuates) the C3 output of C3 logic circuit 97 by a fixed factor B (suitably in the range of 0.1 to 1) to produce the C1 control output. (Note that since the $E_{K-3}$ output of register 94 is not used by any of logic circuits 95–99, it may be eliminated.)

Baseline Wander Compensation Control

Wander logic circuit 95 of FIG. 9 supplies the CONT1 control data input to baseline wander compensation circuit 46 of FIG. 5, suitably a digital-to-analog converter. The SIG2 output of compensation circuit 46 provides a DC offset to the SIG1 signal output of attenuator 42 to compensate for baseline wander wherein, as illustrated in FIG. 2, the MLT-3 waveform drifts below its normal voltage levels, as happens for example when the waveform has relatively few transitions over a relatively long period of time.

As may be seen in FIG. 8, the $E_K$ value will be a –1 when data slicer 52 digitizes the SIG5 waveform when it is a little above any one of its three expected voltage +1, 0, or –1 levels 81, 83 or 85. Conversely, the $E_K$ value will be a +1 when data slicer 52 digitizes the SIG5 waveform when it is somewhat below one of its three defined voltage levels 81, 83 or 85. Thus an $E_K$ value of –1 or +1 indicates that the sampled SIG5 signal voltage is either too high or too low. Accordingly wander logic circuit 95 increments or decrements the CONT1 data when $E_K$ is consistently a –1 or a +1 to cause baseline wander compensation circuit 46 to appropriately increase or decrease the SIG2 voltage, thereby adaptively increasing or decreasing the SIG5 waveform voltage.

FIG. 10 illustrates the logic of wander logic circuit 95 in flow chart form. At system start up, the values of various parameters affecting CONT1 are initialized (step 100). At step 102 the value of $E_K$ is tested. If $E_K$ is equal to –1 a COUNT parameter is decremented (step 104), or if $E_K$ is equal to +1 the COUNT parameter is incremented (step 106). After step 104 or 106, the COUNT parameter is compared to two threshold values (DOWN_TH and UP_TH). If COUNT is less then DOWN_TH, the CONT1 data value is decremented (step 110), thereby decreasing the voltage of the SIG2 signal output of compensation circuit 46. The COUNT parameter is then reset to 0 (step 112). If COUNT is greater than UP_TH, the CONT1 data value is incremented (step 114), thereby increasing the voltage of the SIG2 signal output of compensation circuit 46. The COUNT parameter is then reset to 0 (step 116). After steps 112 or 116, or after step 108 when COUNT is between DOWN_TH and UP_TH, the wander logic circuit waits for an edge of the CLOCK signal marking the next data cycle (step 118) and then returns to step 102 to repeat the process. The threshold values DOWN_TH and UP_TH are appropriately set to dampen the feedback provided by wander logic circuit 95 so that the feedback loop remains stable while being sufficiently responsive to provide adequate baseline wander compensation.

CLOCK Signal Control

FIG. 11 illustrates the SIG5 signal input to data slicer 52 as an idealized MLT-3 waveform. Clock generator 56 of FIG. 5 should produce a CLOCK signal having edges 8 ns apart and occurring at times T1–T4 during the "flat" portions of the SIG5 signal when it is stable and not in transition.

FIG. 12 illustrates the logic carried out by clock logic circuit 96 of FIG. 9 supplying the digital CONT2 signal to clock generator 56 of FIGS. 5 and 7 for controlling the phase of the CLOCK signal relative to the SIG5 signal. Clock logic circuit 96 monitors the $E_K$, $E_{K-1}$, $A_K$ and $A_{K-1}$ data outputs of encoder 90 and register 92 to determine whether CLOCK signal edges occur too early or too late relative to the SIG5 signal data cycle. Circuit 96 increases the value of the CONT2 signal when necessary to retard the CLOCK signal phase and decreases the value of the CONT2 when necessary to advance the CLOCK signal phase.

At system start up, the values of various parameters affecting CONT2 are initialized (step 120). Then, at step 122, clock logic circuit 96 determines the value of the quantity $(E_K A_{K-1} - E_{K-1} A_K)$. When the SIG5 signal is in transition between CLOCK cycles K−1 and K, the quantity $(E_K A_{K-1} - E_{K-1} A_K)$ will be either a −1 or a +1 and will indicate whether the CLOCK signal edge is occurring too soon or too late relative to the data cycles of SIG5 signal. When the SIG5 signal is not in transition between CLOCK cycles K−1 and K, then the quantity $(E_K A_{K-1} - E_{K-1} A_K)$ will normally be a 0 and will have no influence on whether the CLOCK signal is too soon or too late. When the quantity $(E_K A_{K-1} - E_{K-1} A_K)$ is equal to −1 a COUNT parameter is decremented (step 124), when the quantity $(E_K A_{K-1} - E_{K-1} A_K)$ is equal to +1 the COUNT parameter is incremented (step 126). Otherwise when the quantity $(E_K A_{K-1} - E_{K-1} A_K)$ is a 0, the COUNT parameter remains unchanged.

After steps 124 or 126, or after step 122 if the quantity $(E_K A_{K-1} E_{K-1} A_K)$ is equal to 0, the COUNT parameter is compared to two threshold values, ADV_TH and RET_TH (step 128). If COUNT is less than retard threshold RET_TH, the CONT2 data value is incremented (step 130), thereby retarding the phase of the CLOCK signal output of clock generator 56 (FIG. 5) relative to the SIG5 signal. The COUNT parameter is then reset to 0 (step 132). When COUNT is greater than advance threshold ADVT_TH, the CONT2 data value is decremented (step 134), thereby advancing the CLOCK signal relative to the SIG5 signal, and the COUNT parameter is reset to 0 (step 136). After steps 132 or 136, or after step 128 if COUNT lies between ADV_TH and RET_TH, the clock logic circuit waits for an edge of the CLOCK signal marking the next data cycle (step 138) and then returns to step 122 to repeat the process. The threshold values ADV_TH and RET_TH are appropriately set to dampen the feedback provided by clock logic circuit 96 so that the feedback loop remains stable while being sufficiently responsive to provide adequate CLOCK signal phase control.

C3 Control

FIG. 13 illustrates the logic carried out by C3 logic circuit 97 of FIG. 9 generating the C3 signal controlling the gain of amplifier 66 of FIR filter 48 of FIG. 6. Logic circuit 97 monitors the $E_{K-2}$ and $A_{K-3}$ data outputs of registers 93 and 94 to determine whether the C3 signal should be increased or decreased so as to increase or decrease the gain of amplifier 66 of FIG. 6. When the quantity $(E_{K-2} A_{K-3})$ is consistently equal to −1, the SIG5 signal is over-equalized and C3 is decremented to decrease the gain of amplifier 64. When the quantity $(E_{K-2} A_{K-3})$ is consistently equal to +1, the SIG5 is under-equalized and C3 is incremented to increase the gain of amplifier 64.

At system start up, the values of various parameters affecting C3 are initialized (step 140). Then, at step 142, C3 logic circuit 97 determines the value of the quantity $(E_{K-2} A_{K-3})$. When the quantity $(E_{K-2} A_{K-3})$ equal to −1 a COUNT parameter is decremented (step 144), and when the quantity $(E_{K-2} A_{K-3})$ is equal to +1 the COUNT parameter is incremented (step 146). Otherwise when the quantity $(E_{K-2} A_{K-3})$ is 0, the COUNT parameter remains unchanged.

After steps 144 or 146, or after step 142 if the quantity $(E_{K-2} A_{K-3})$ is equal to 0, the COUNT parameter is compared to two threshold values, C3DEC_TH and C3INC_TH (step 148). When COUNT is less than C3DEC_TH, the C3 data value is decremented (step 150), thereby decreasing the gain of amplifier 64 of FIG. 6. The COUNT parameter is then reset to 0 (step 152). When COUNT is greater than C3INC_TH, the C3 data value is incremented (step 154), thereby increasing the gain of amplifier 64 of FIG. 6. After steps 152 or 156, or after step 158 if COUNT is between C3DEC_TH and C3INC_TH, the C3 logic circuit waits for an edge of the CLOCK signal marking the next data cycle (step 158) and then returns to step 142 to repeat the process. The threshold values C3DEC_TH and C3INC_TH are appropriately set to dampen the feedback provided by clock logic circuit 97 so that the feedback loop remains stable while being sufficiently responsive.

Multiplier 100 of FIG. 9 multiplies the C3 signal output by a factor of B to produce the C1 control signal controlling the gain of amplifier 64 of FIG. 6. The optimal value of B is a function of the frequency response characteristics of the CAT5 (category 5) twisted pair cable conveying the INPUT signal and the cable length. Since the frequency response characteristics of all CAT5 cables are substantially similar, and since the value of B is only weakly dependent on cable length, the value of B may be set to a fixed value that is suitably within the range between 0.1 and 1.

C2 Control

FIG. 14 illustrates in flow chart form the logic carried out by logic circuit 98 of FIG. 9 generating the C2 signal controlling the gain of amplifier 65 of FIR filter 48 of FIG. 6. The C2 signal influences the amount of compensation FIR filter 48 provides for the insertion loss of the CAT5 cable conveying the input signal. Logic circuit 98 monitors the $E_{K-2}$ and $A_{K-2}$ data outputs of register 93 to determine whether the C2 signal should be increased or decreased so as to increase or decrease the gain of amplifier 65 of FIG. 6. When the quantity $(E_{K-2} A_{K-2})$ is consistently equal to −1, the SIG5 signal is over-compensated for insertion loss and C2 is decremented to decrease the gain of amplifier 64. When the quantity $(E_{K-2} A_{K-2})$ is consistently equal to +1, the SIG5 is under-compensated for insertion loss and C2 is incremented to increase the gain of amplifier 65.

At system start up, the values of various parameters are initialized (step 160). Then, at step 162, C2 logic circuit 98 determines the value of the quantity $(E_{K-2} A_{K-2})$. When the quantity $(E_{K-2} A_{K-2})$ is equal to −1 a COUNT parameter is decremented (step 164), and when the quantity $(E_{K-2} A_{K-2})$ is equal to +1 the COUNT parameter is incremented (step 166). Otherwise when the quantity $(E_{K-2} A_{K-2})$ is a 0, the COUNT parameter remains unchanged.

After steps 164 or 166 or after step 162 if the quantity $(E_{K-2} A_{K-2})$ is equal to 0, the COUNT parameter is compared to two threshold values, C2DEC_TH and C2INC_TH (step 168). When COUNT is less than C2DEC_TH, the C2 data value is decremented (step 170), thereby decreasing the gain of amplifier 65 of FIG. 6. The COUNT parameter is then reset to 0 (step 172). When COUNT is greater than C2INC_TH, the C2 data value is incremented (step 174), thereby increasing the gain of amplifier 65 of FIG. 6. After steps 172 or 176 or after step 168 if COUNT is between C2DEC_TH and C2INC_TH, the C2 logic circuit waits for an edge of the CLOCK signal marking the next data cycle (step 178) and then returns to step 162 to repeat the process. The threshold values C2DEC_TH and C2INC_TH are appropriately set to dampen the feedback provided by clock logic circuit 98 so that the feedback loop remains stable while being sufficiently responsive to provide adequate insertion loss compensation.

DATA Logic

FIG. 15 illustrates the logic of data logic circuit 99 of FIG. 9 in flow chart form. Data logic circuit 99 produces as output the value of data $DATA_K$ represented by the SIG5 signal during the Kth data cycle. At system start up, the values of various parameters affecting the $DATA_K$ value are initialized (step 180). Then, at step 181, data logic circuit 98 determines the value of the quantity $(A_{K-1}-A_K)$. When the quantity $(A_{K-1}-A_K)$ is equal to 0 the receiver's output $DATA_K$ output is set to the value of data output $DATA_{K-1}$ for the preceding data cycle K-1(step 184). When the quantity $(A_{K-1}-A_K)$ is not equal to 0, the value of $DATA_{K-1}$ is compared to 1 (step 183). If $DATA_{K-1}$ is equal to 1, the receiver's data output $DATA_{K-1}$i is set to 0 (step 184). If $DATA_{K-1}$ is not equal to 1, the receiver's data output $DATA_{K-1}$ is set to 1 (step 185). After setting the value of $DATA_K$ at steps 182, 184 or 185 data logic circuit 99 waits for another CLOCK signal edge (step 186) and thereafter returns to step 181 to repeat the process for the next data cycle.

Alternative Embodiment

FIG. 16 illustrates an alternative version 190 of a 100Base-TX receiver in accordance with the invention that is generally similar to receiver 40 of FIG. 5. However FIR filter 48 of receiver 40 of FIG. 5 including three delay circuits 61–63 as illustrated in FIG. 6, is replaced in receiver 190 by a FIR filter 192 having a set of three sample and hold (S/H) circuits 193–195 (FIG. 17) clocked by the CLOCK signal output of clock generator 56. The clock circuit 196 of receiver 190 of FIG. 16 is similar to clock circuit 56 of FIG. 7 except that devices 76 and 78 are omitted since the CONT3 signal output is not needed. The attenuator 197, low-pass filter 198, data slicer 199, baseline wander compensation circuit 200 and adaptive control circuit 201 of receiver 190 are similar to similarly named components of receiver 40 of FIG. 5.

Thus has been shown and described alternative versions of a 100Base-TX receiver employing an FIR filter providing both equalization and insertion loss compensation for a MLT-3 signal. In comparison to typical prior art receivers, the relative simplicity of the FIR filter-based receiver enables it to be implemented on a relatively smaller area on an integrated circuit die and enables it to operate with less power consumption.

While the forgoing specification has described preferred embodiments of the present invention, one skilled in the art may make many modifications to the preferred embodiment without departing from the invention in its broader aspects. The appended claims therefore are intended to cover all such modifications as fall within the true scope and spirit of the invention.

What is claimed is:

1. An apparatus for receiving and processing a first waveform (SIG3) representing successive bits of a data sequence during successive data cycles, wherein a state of each successive bit of the data sequence is indicated by whether the first waveform transitions between voltage levels during a corresponding one of the data cycles, and wherein the apparatus produces an output digital data signal representing the data sequence, the apparatus comprising:

filter means for filtering the first waveform to provide equalization and gain control, thereby producing a second waveform (SIG5) representing successive bits of the data sequence during successive data cycles, wherein the state of each successive bit of the data sequence is indicated by whether the second waveform transitions between defined voltage levels during a corresponding one of the data cycles, wherein the filter means implements a filter function having N adjustable coefficients adjusted by coefficient control signals (C1, C2, C3) supplied as input to the filter means, wherein N is an integer greater than 2, wherein each of the N adjustable coefficients influences a relationship between the first and second waveforms;

a data slicer for repeatedly digitizing the second waveform in response to edges of a clock signal to produce data output indicating a voltage range of the second waveform;

a clock signal generator for supplying the clock signal to the data slicer with a phase determined by a phase control signal; and an adaptive control circuit for processing the data output of the data slicer to produce and supply the coefficient control signals to the filter means, to produce and supply the phase control signal to the clock signal generator, and to produce the digital data signal.

2. The apparatus in accordance with claim 1 wherein the filter means comprises an N-stage finite impulse response (FIR) filter implementing the filter function.

3. The apparatus in accordance with claim 2 wherein the N-stage FIR filter comprises:

N delay stages connected in series for successively delaying the first waveform to produce a set of N first delayed waveforms (SIG31, SIG32, SIG33);

N amplifiers, each for amplifying a first delayed waveform output of a corresponding one of the delay stages to with a gain controlled by a separate one of the coefficient control signals to produce a set of N second delayed waveforms (SIG41, SIG42, SIG43);

means for summing the set of N second delayed waveforms to produce a third waveform (SIG4).

4. The apparatus in accordance with claim 3 wherein the filter means further comprises a low-pass filter for low-pass filtering the third waveform to produce the second waveform.

5. The apparatus in accordance with claim 3 wherein N is three.

6. The apparatus in accordance with claim 3 wherein the coefficient control signals produced by the adaptive control circuit adjust the gain of each of the N amplifiers to adaptively equalize the second waveform.

7. The apparatus in accordance with claim 6 wherein the coefficient control signals produced by the adaptive control circuit also adjusts the gains of N amplifiers to provide automatic gain control of the second waveform.

8. The apparatus in accordance with claim 5 wherein N is three, and wherein a gain of one of the N amplifiers is a fixed multiple of a gain of another of the amplifiers.

9. The apparatus in accordance with claim 8 wherein the fixed multiple is within in a range of 0.1 to 1.

10. The apparatus in accordance with claim 3 wherein the clock signal generator also produces an analog signal (CONT3) controlling the delay of each of the delay stages.

11. The apparatus in accordance with claim 3 wherein each of the delay stages comprises a sample and hold circuit clocked by the clock signal.

12. The apparatus in accordance with claim 1 wherein N is equal to 3, wherein the second waveform has three defined voltage levels, wherein the data produced by the data slicer represents the voltage of the second waveform as residing in one voltage range of a set of three pairs of voltage ranges, wherein each the pair of voltage ranges bounds a separate one of the three defined voltage levels, and wherein the adaptive control circuit processes the data output of the data slicer corresponding to two successive data cycles of the second waveform to produce and supply the coefficient control signals to the filter means, to produce and supply the phase control signal to the clock signal generator, and to produce the output digital data signal.

13. A receiver for receiving and processing an input waveform (INPUT) representing successive bits of a data sequence during successive data cycles, wherein a state of each successive bit of the data sequence is indicated by whether the input waveform transitions between three voltage levels during a corresponding one of the data cycles, and wherein the receiver produces a digital data signal (DATA) representing the data sequence, the receiver comprising:

an attenuator for receiving and attenuating the input waveform to produce a first waveform (SIG1);

means for level shifting the first waveform in response to a second waveform (SIG2) to produce a third waveform (S1S3);

a finite impulse response (FIR) filter for filtering the third waveform to provide equalization and gain control, thereby producing a fourth waveform (SIG. 4) representing successive bits of the data sequence during successive data cycles, wherein the state of each successive bit of the data sequence is indicated by whether the second waveform transitions between defined voltage levels during a corresponding one of the data cycles, wherein the FIR filter implements a filter function having three coefficients adjusted by coefficient control signals (C1, C2, C3) supplied as input to the FIR filter, a low-pass filter for filtering the fourth waveform to produce a fifth waveform (SIG5);

a data slicer for repeatedly digitizing the fifth waveform in response to edges of a clock signal to produce data (SLICE_DATA) indicating a voltage range of the second waveform;

a clock generator for supplying the clock signal to the data slicer with a phase determined by a phase control signal; and an adaptive control circuit for processing the data produced by the data slicer to produce and supply the coefficient control signals as input to the FIR filter, to produce and supply the phase control signal to the clock generator, and to produce the digital data signal.

14. The receiver in accordance with claim 13 wherein the FIR filter comprises:

three delay stages connected in series for successively delaying the third waveform to produce a set of three first delayed waveforms (SIG31, SIG32, SIG33);

three amplifiers, each for amplifying a first delayed waveform output of a corresponding one of the three delay stages with a gain controlled by a separate one of the coefficient control signals to produce a set of three second delayed waveforms (SIG41, SIG42, SIG43);

means for summing the set of three second delayed waveforms to produce the fourth waveform.

15. The receiver in accordance with claim 14 wherein the coefficient control signals produced by the adaptive control circuit adjust amplifier gains such that the FIR filter adaptively equalizes the fifth waveform.

16. The receiver in accordance with claim 15 wherein the coefficient control signals produced by the adaptive control circuit also adjust amplifier gains such that the FIR filter provides automatic gain control for the fifth waveform.

17. The receiver in accordance with claim 16 wherein a gain of one of the three amplifiers is a fixed multiple of a gain of another of the three amplifiers.

18. The receiver in accordance with claim 14 wherein the clock signal generator also produces an analog signal controlling the delay of each of the delay stages.

19. The receiver in accordance with claim 14 wherein each of the delay stages comprises a sample and hold circuit clocked by the clock signal.

20. The receiver in accordance with claim 14 wherein the fifth waveform has three defined voltage levels, wherein the data produced by the data slicer indicates the voltage of the fifth waveform as residing in one voltage range of a set of three pairs of voltage ranges, wherein each the pair of voltage ranges bounds a separate one of the three defined voltage levels, and wherein the adaptive control circuit processes the data output of the data slicer corresponding to two successive data cycles of the fifth waveform to produce and supply the coefficient control signals to the filter means, to produce and supply the phase control signal to the clock signal generator, and to produce the digital data signal.

* * * * *